United States Patent [19]

Lewis

[11] Patent Number: 4,622,514
[45] Date of Patent: Nov. 11, 1986

[54] MULTIPLE MODE BUCKLING BEAM PROBE ASSEMBLY

[75] Inventor: Stephan P. Lewis, Hermosa Beach, Calif.

[73] Assignee: IBM, Armonk, N.Y.

[21] Appl. No.: 620,983

[22] Filed: Jun. 15, 1984

[51] Int. Cl.⁴ ............................................. G01R 1/073
[52] U.S. Cl. ................... 324/158 P; 324/72.5
[58] Field of Search ........... 324/158 F, 158 P, 73 PC; 339/176 M

[56] References Cited

U.S. PATENT DOCUMENTS

| 3,806,801 | 4/1974 | Bove | 324/72.5 |
| 4,506,215 | 3/1985 | Coughlin | 324/158 P |
| 4,518,910 | 5/1985 | Hottenrott et al. | 324/158 P |

OTHER PUBLICATIONS

Faure, L. et al., "Controlled Direction Buckling Beam", IBM Tech. Disclosure Bull., vol. 17, No. 5, Oct. 1974, p. 1375.
Faure, L. et al., "Probe-to-Coupling Block Pressure Contact with Dust Seal," IBM Tech. Disclosure Bull., vol. 18, No. 3, Aug. 1975, p. 701.
Kostenko, A. Jr., "High Density Contactors to Electrical Space Transformers", IBM Tech. Disclosure Bull., vol. 15, No. 10, Mar. 1973, p. 3035.
Kostenko, A. Jr., "Buckling Direction Control in High Density Contactors", IBM Tech. Disclosure Bull., vol. 15, No. 11, Apr. 1973, p. 3543.
Faure, L. et al., "Pin Pad Contactor", IBM Tech. Disclosure Bull., vol. 17, No. 2, Jul. 1974, pp. 444–445.
Till, A., "Column Contact Probe", IBM Tech. Disclosure Bull., vol. 12, No. 4, Sep. 1969, p. 551.
Lipschutz, L. et al., "Buckling Wire Probe Assembly", IBM Technical Disclosure Bulletin, vol. 15, No. 10, Mar. 1973, pp. 3032–3034.
Bruder, S. et al., "Dual Buckling Beam Connectors . . . " IBM Technical Disclosure Bulletin, vol. 17, No. 2, Jul. 1974, pp. 638–639.

Primary Examiner—Reinhard J. Eisenzopf
Assistant Examiner—Stephen M. Baker
Attorney, Agent, or Firm—Sughrue, Mion, Zinn, Macpeak & Seas

[57] ABSTRACT

A multiple mode buckling beam probe is formed by top and bottom mating locating guides interposed between a space transformer die bearing exposed wire contact ends and an underlying substrate having correspondingly positioned conductive pads. Wire probes pass slidingly through aligned holes within the top and bottom mating locating guides. At least one center locating guide having correspondingly aligned holes with the top and bottom locating guides slidably receives the wire probes and is spaced at different distances from the top and bottom locating guides. Interposed between the center locating guide and the top and bottom locating guides are respective slotted guides having elongated slots through which the wire probes pass, which slots are offset relative to the top, bottom and center locating guide holes. This permits an increase in axial deflections of the wire probes over a standard buckling beam probe, adequately confines the directionality of the buckling wire probes, achieves greater probe density, and permits the controlled sequence and magnitude of each buckle in multiple mode buckling with the characteristic force versus deflection curve for the buckling wire probes being tailorable to a specific user's need.

3 Claims, 8 Drawing Figures

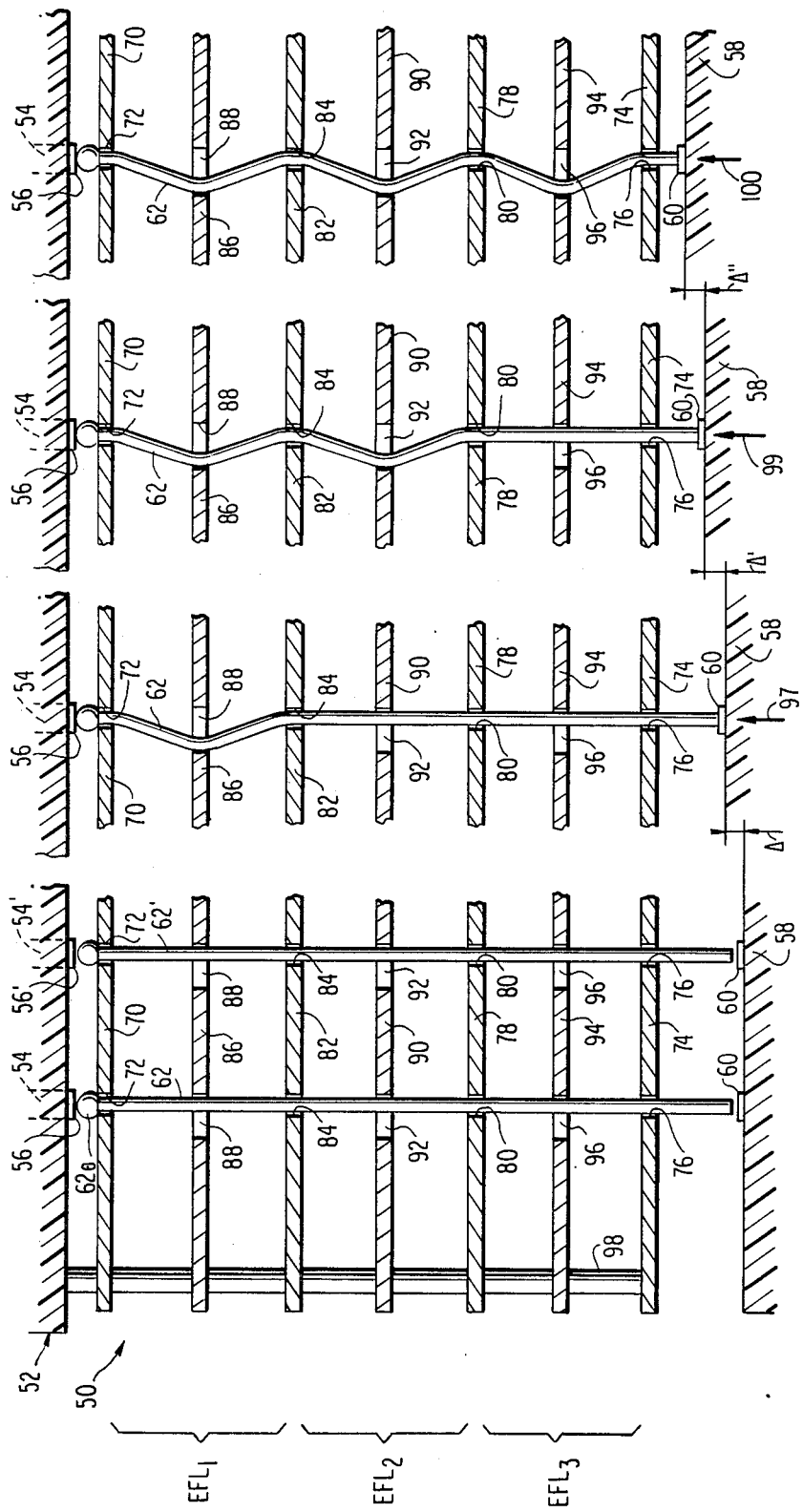

MULTIPLE MODE BUCKLING BEAM PROBE ASSEMBLY

BACKGROUND OF THE INVENTION

Buckling wire or beam probes have come into vogue for facilitating the testing of electrical characteristics of integrated circuits connected to pads on a semiconductor chip wherein the flexing or buckling wire probes engage at opposite ends, the pads and contact points on the tester space transformer die by relative movement of the substrate toward the space transformer die. A typical buckling beam probe assembly is set forth in U.S. Pat. No. 3,806,801 issued Apr. 23, 1974, to Ronald Bove and assigned to the common corporate assignee.

The application of axial forces on the wire probes causes the wire probes or beams to buckle laterally under axial compressive force, the result of which is to insure low ohmic contact of each current conducting wire probe, at respective ends, to the space transformer die contact and the chip carried pad. If the force of the probe engaging the pad exceeds that for which the pad or chip has been designed, then the pad and/or chip may be damaged. Such systems are complicated by the fact that it is necessary to space the probes sufficiently from each other to enable such deflection without the probes contacting each other and shorting out the probes.

Referring to FIG. 1 of the drawings, in a typical buckling beam probe assembly 10, the underlying substrate 18 is placed some distance from the overlying space transformer die 12 carrying the potted wire contacts 14 whose ends 16 are exposed at the bottom of the space transformer die 12. Typically, a top mating locating guide 22 and a bottom locating guide 34 are provided in juxtaposition to the space transformer die 12 and a substrate 18, respectively, but spaced somewhat therefrom, and wherein both of these locating guides 22, 34 are provided with small diameter holes 24 and 36, respectively, sized slightly larger than the diameter of the probes passing therethrough, so as to slide therein. Thus the wire probes 38, absent deflection, are aligned throughout their axes with the wire contacts 14 of the space transformer die 12, and pads 20 on the substrate 18. In addition, there is normally provided an offset die 26 whose holes 28 through which the wire probes 38 pass, are offset relative to the holes 24 of the locating guides to thus bias the wire probes to buckle laterally, in a given direction. Additionally, a floating die 30 is employed intermediate of the offset die and the lower locating guide to isolate and insulate the probe wires such that during axial applied force, the wires are axially deflected, and under the applied axial force 40, the lateral deflections result in a controlled manner and in preset directions defined by the offset die. Typically, all guides and dies are connected to the space transformer die 12 and movable as an assembly relatively toward and away from the underlying substrate 18.

FIGS. 2 and 3 are plots which show applied force versus axial deflection, and lateral deflection versus applied axial deflection for such typical buckling beam probe assemblies. In FIG. 2, under initial applied axial force, the wire probes deflect axially to a limited degree during initial lateral deflection and then to a greater degree when the axial force reaches a predetermined value. In FIG. 3, the lateral versus axial deflection curve shows that, for small axial deflections, that there are relatively large lateral deflections. This characteristic limits the application of buckling beam probes for two main reasons. First, when probing a complex (dense) pattern, only very small probe axial deflections can be handled. The wire probes tend to come into lateral contact with each other and short out. Even if floating die is used to isolate the probes and to thus insulate them electrically, it too is limited due to the floating die causing some of the probes to buckle without achieving contact. Secondly, even if the lateral deflections are not critical for contact reasons, a large buckle will be constricted due to the increase in frictional force of the dies (binding effect on the wire probes). In addition, too much axial deflection will cause the beams, i.e. the probe wires, to permanently buckle. Therefore, there are substantial limits in the use of buckling beam probes, as conventionally fabricated, since complex (dense) patterns need very uniform probing surfaces and the overall axial deflections of conventional buckling beams are limited to about five mils maximum.

Some attempts have been made to provide buckling beam probes whose probe wires operate under multiple mode buckling. Such concepts are set forth in IBM Technical Disclosure Bulletin, Vol. 17, No. 2, July 19, 1974, pages 444 and 638. In both these disclosures, the multiple buckling modes of the connectors/contactors are independent, i.e. separate, which while being a step in the right direction, require isolation of the wire probes into two halves, one to the connector side and the other to the contactor side.

It is, therefore, a primary object of the present invention to provide a buckling beam probe assembly which permits increase in the axial deflections of the wire probes while maintaining desired force deflection characteristics, and in which lateral deflections are decreased, permitting an increase in density of the probing pattern and allowing the probing of more varied probing surfaces, and wherein the buckling beam assembly may be tailored to a user's specific needs by use of multiple mode buckling.

SUMMARY OF THE INVENTION

The invention is basically directed to a buckling beam assembly in which the wire probes are buckled in multiple modes, and wherein each separate buckle increases the axial deflection while maintaining a set maximum lateral deflection. The amount of lateral deflection is controlled by the use of laterally slotted planar locating guides, these slotted guides are used to bias the initial buckling mode, control the buckling direction and isolate individual wire probes to prevent the probe wires from contacting each other. The assembly includes a middle locating guide intermediate of the slotted guides whose slots are offset with respect to aligned holes within the middle guide, and the top and bottom locating guides in juxtaposition to wire contacts borne by the space transformer die at the top of the assembly and the underlying substrate bearing the chip pads at the bottom of the assembly. Thus, the wire probes are allowed to slide freely through the middle locating guide with the middle locating guide permitting free transfer of the axially applied force from the lower buckle to the upper buckling mode. Additionally, the middle locating guide is purposely spaced at a different distance from the lower locating guide than it is to the upper locating guide. As a result, since the effective free length of one buckling mode is larger than the effective free length of the other buckling mode, the wire probes will buckle in a first mode where the distance is greater between the middle locating guide and the adjacent locating guide when the probe wires are subjected to their initial axial deflections. Once the buckling mode's lateral deflection butts up against the slotted guide slot end, its effective free length is halved. Increased load (axial deflection) will cause the buckling of the probe wires in the second buckling mode between that middle locating die and the closer locating die. Dependent upon the relative effective free lengths of the buckling modes, a force deflection curve may thus be tailored for a user's specific needs.

In a preferred form, multiple center locating guides are interposed between top and bottom locating guides, all of which have holes of common diameter and axial alignment both with themselves and the substrate pads and space transformer die contacts. In each instance, slotted guides are employed intermediate of the center locating guides, or the center locating guides and the top and bottom locating guides, to control and direct the deflections for the sequential modes with the slots of the slotted guides having their centers offset with respect to the axes of the holes within the various locating guides.

BRIEF DESCRIPTION OF THE DRAWINGS

FIGS. 4a through 4d inclusive are vertical sectional views of a three buckling mode multiple buckling beam probe assembly of the present invention showing the sequence of deflection modes for the wire probes thereof.

DESCRIPTION OF THE PREFERRED EMBODIMENT

Figure 1:
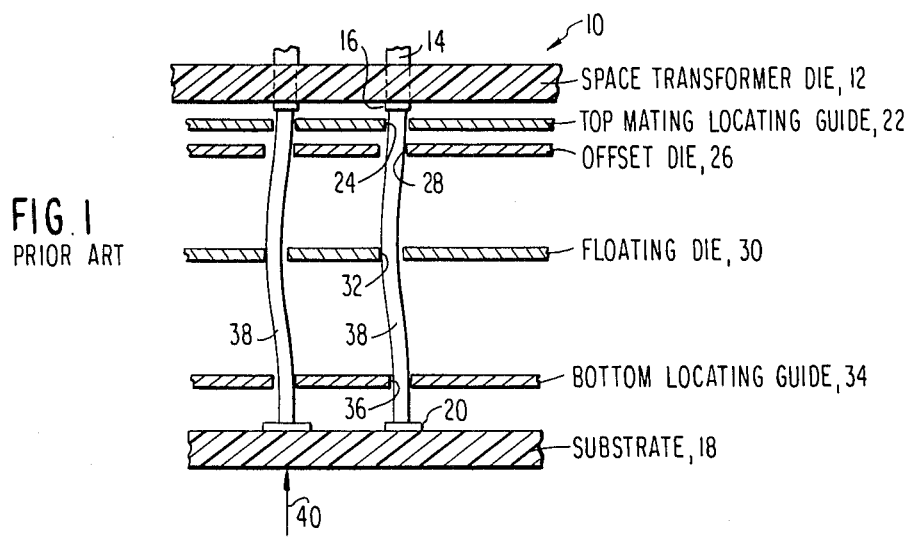
FIG. 1 is a vertical sectional view of a prior art single mode buckling beam probe assembly.
Figure 2:
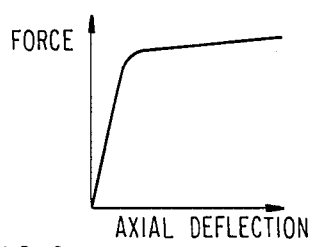
FIG. 2 is a force versus axial deflection plot for the probe wires of the assembly of FIG. 1.
Figure 3:
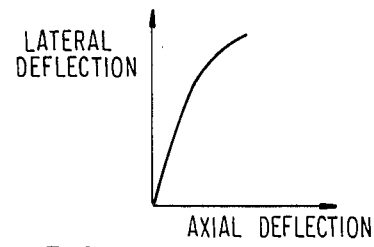
FIG. 3 is a plot of lateral versus axial deflection of the probe wires of the assembly of FIG. 1.

Referring to FIGS. 4a through 4d inclusive, there is shown specifically in FIG. 4a, a controlled multiple buckling beam probe assembly indicated at 50, with each separate buckling acting to increase the axial deflection of the probe while maintaining a set minimum lateral deflection of the wire probes, controlled by the length of the slots within multiple slotted guides employed in the assembly 50. Many of the elements making up the assembly 50 have counterparts within the prior art buckling beam probe assembly 10, illustrated in FIG. 1. In that respect, a space transformer guide 52, functions as the tester interface and incorporates at 54 and 54' wire contacts whose lower ends 56 and 56' are exposed beneath the bottom of the transformer guide 52 and permit the supply of electrical current to the substrate 58 at the lower end of the probe assembly 50. The substrate 58 may be supported for movement upwardly in the direction of the transformer die 52 in the manner of U.S. Pat. No. 3,806,801 referred to previously. On the top of the substrate 58, there are provided at spaced positions, electrically conductive pads 60, 60' at exact correspondingly spaced positions to, and oriented in axial alignment with the contacts 54, 54' of the relatively fixed space transformer die 52.

The probe assembly 50 is comprised, in order, from the space transformer die 52 in the direction of substrate 58, of a top locating guide 70, a first slotted guide 86, a first center locating guide 82, a second slotted guide 90, a second center locating guide 78, a third slotted guide 94, and a bottom locating guide 74. The first and second center Locating guides 82 and 78, respectively, are similar to and function in the manner of the top and bottom locating guides 70 and 74, respectively. In that respect, the top locating guide 70 is provided with relatively small diameter holes as at 72 which are of a diameter slightly larger than that of the wire probes 62, 62' which pass therethrough to permit relative sliding of the wire probes within those holes. In like fashion, similarly sized holes are provided at 84 within the first center locating guide 82, at 80 for the second center locating guide 78, and at 76 for the bottom locating guide 74. Wire probes or beams 62 and 62' are of a length such that when the substrate 58 and the space transformer die 52 forming the tester interface use at their maximum spacing, the wire probes 62 are straight and undeflected and without any applied axial force applied thereto. There headed ends 62a cause the wire probes to be maintained suspended in assembly 50 and straight, absent applied axial compression forces thereto.

Important to an appreciation of the present invention, is the fact that the first, second and third slotted guides 86, 90 and 94, include slots as at 88, 92 and 96, respectively, within the same whose centers are offset to the axes of the holes 72, 84, 80 and 76 within respective top locating guide, first and second center locating guides, and bottom locating guide. The slots therefore control the extent of and nature of the localized deflections or buckling. It is the effective free lengths of the portions of the probe wires between the top 70 and center 82 locating guides, the first 82 and second 78 center locating guides, and the second center locating guide 78 and the bottom locating guide 74, respectively, which determine the mode sequence in buckling of the wire probes 62, 62' due to axial applied force on the probe wires. Such axial force is derived by relative movement of the substrate 58 towards the space transformer die 52. All of the guides are at fixed positions and at fixed vertical spacings with respect to each other by multiple, spaced mounting rods or bars 98 extending downwardly from the space transformer 52 to the bottom locating guide 74, through all the other guides and being fixed thereto to achieve that purpose. Again, such structural arrangement is conventional and may be readily ascertained from prior art patents and publications, such as U.S. Pat. No. 3,806,801.

In the illustrated embodiment of FIGS. 4a through 4d inclusive, the effective free Lengths for the successive deflecting portions of the wire probes 62, 62' differ from each other and decrease from the top of assembly 50 towards the bottom. As shown, therefore, $EFL_1$ is larger than $EFL_2$, which, in turn, is larger than $EFL_3$. This means that the distance between the top locating guide 70 and the first center locating guide 82 is somewhat greater than the spacing or distance between the first center locating guide 82 and the second center locating guide 78 while, in turn, that spacing is somewhat larger than the spacing between the second center locating guide 78 and the bottom locating guide 74. The relationship is as follows:

$$EFL_1 > EFL_2 > EFL_3 > (EFL_1/2)$$

Thus, each separate buckle increases the axial deflection of the wire probes 62, 62', while maintaining a set maximum lateral deflection defined by the length of the slots as at 88, 92 and 96 within slotted guides 86, 90 and 94, respectively. The slotted guides 86, 90 and 94 are used to bias the initial buckling mode, control the buckling direction, isolate individual probes 62 from contacting each other, and limit the lateral deflections of the probes 62. The probes are allowed to freely slide through the center locating guides 82, 78 as well as the top locating guide 70 and bottom locating guide 74 of the probe assembly 50. The center locating guides or dies 82, 78 determine the effective free length of each buckling mode, while permitting free transfer of force along the length of the probe.

As seen in the sequence from FIGS. 4a through 4d, due to the different effective free lengths ($EFL_1$ $EFL_2$ and $EFL_3$), a wire probe as at 62 will buckle in mode No. 1, FIG. 4b, upon the application of an initial axial force indicated by arrow 97, when the substrate 58 is shifted vertically upwards by a distance Δ. In the illustrated embodiment, this vertical rise of the substrate 58 is shown as being 0.008 inch. Once this buckling mode's lateral deflection causes the wire probe 62 to abut against the left end of slot 88, its effective length is halved. Increased load axial deflection) as evidenced by arrow 99 is a result of the substrate 58 being raised another increment as at Δ', the effect of which is to cause wire probe 62 to buckle where its effective free length is now the longest, i.e. to the extent of $EFL_2$. This causes a second localized buckling of the wire probe 62 between the first center locating guide 82 and the second center locating guide 78 to the extent again where this localized second buckling portion of the wire probe 62 contacts the left end of slot 92 of the second slotted guide 90, FIG. 4c. The incremental vertical movement of the substrate 58 again is shown as being 0.0008", i.e. as indicated at Δ' in FIG. 4c.

This cycle is repeated over and over, buckling where the effective free length is greatest, depending upon the relative effective free length of each of the buckling modes. FIG. 4d shows the third mode, in which case the effective free length ($EFL_3$, is the greatest effective free length portion of the wire probe 62 under axially applied force. A further increase in applied vertical force by raising the substrate incrementally at Δ," in the equal amount of an 0.0008" increment causes lateral buckling to occur for the portion of the wire probe 62 between the second center locating guide 78 and the bottom locating guide 74. The buckling is limited between the second center locating guide 78 and the bottom locating guide 74. Buckling again is limited by the length of slot 96 within the third slotted guide 94 and when the buckled portion of the wire probe 62 abuts the left end of slot 96, further buckling of the wire probe 62 ceases. Depending upon the relative effective free lengths of each of the buckling modes, this design can be extended to use more guides and increased buckling modes to allow larger axial deflections and/or complex force deflection characteristics.

Figure 5:
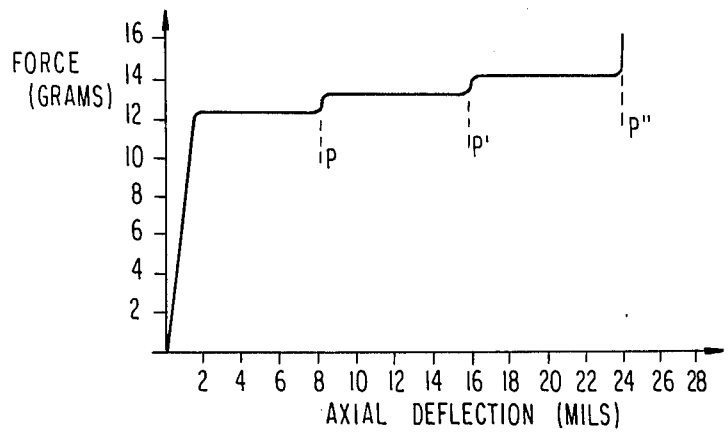
FIG. 5 is a force versus axial deflection plot for the multiple buckling beam probe assembly of FIGS. 4a through 4d inclusive.

Reference to FIG. 5 shows a plot of applied force in grams against axial deflection in mils for the multiple wire probes 84 of the multi-mode buckling beam probe assembly 50. As may be appreciated by reference to FIGS. 4a through 4d inclusive, while two wires probes 62, 62' are illustrated in FIG. 4a, the succeeding FIGS. 4b, 4c and 4d show only the leftmost wire probe 62 under first, second and third mode deflection to illustrate in sequence the multiple mode deflections of the various wire probes, each being identical.

In correlating FIG. 5 to FIGS. 4b, 4c and 4d, the applied force evidenced by arrow 97 in FIG. 4b increases to the extent of 12 grams prior to initiation of probe lateral deflection. The axial deflection at the point of initial lateral deflection is twelve mils. Axial force application of 12 grams, under axial deflection of 8 mils, causes lateral deflection to point P on the plot. This is the lateral limit for the first mode buckle and the point where the wire probe 62 abuts the left end of slot 88 in the first slotted guide 86, FIG. 4b. Continued increase in applied axial force to thirteen grams causes the wire probe 62 to start buckling in the second mode, FIG. 4c, and this buckling continues under axial deflection of approximately 17 mils to point P', at which the wire probe 62 terminates its second mode buckling since the buckled wire probe 62 now abuts the left end of slot 92 of the second slotted guide 90. Upon an increase in applied axial force from 13 to 14 grams, the wire probes such as 62 buckle in the third mode between second center locating guide 78 and bottom locating guide 74. That third mode buckling continues during axial deflection from 16 to 24 mils at which point P" is reached which is the lateral limit for the third buckle. Axial deflection ceases, in spite of the increase of applied axial force which is shown on the plot as rising from 14 to 16 grams. The wire probes such as probe 62 cannot buckle to any greater extent because the buckling is limited laterally by the length of the slots as at 88, 92, 96 within first, second and third slotted guides 86, 90 and 94 respectively.

In the illustrated embodiment, as exemplified by the force versus axial deflection curve of FIG. 5, the material forming the wire probes 84 is Paliney 7 alloy, and the probe wires have a diameter of 0.005 inch.

While the invention has been partially shown and described with reference to a preferred embodiment thereof, it will be understood by those skilled in the art that various changes in form and details may be made therein without departing from the spirit and scope of the invention.

I claim:

1. A multiple mode buckling beam probe assembly for testing electrical characteristics of integrated circuits connected to pads on a semiconductor chip substrate, said assembly comprising:
    a space transformer die movable relatively towards and away from said substrate and spaced therefrom,
    said space transformer die bearing potted wires forming laterally spaced contacts facing the substrate chip pads with said contacts being in general axial alignment with said pads, respectively,
    first and second planar locating guides positioned between said transformer die and said substrated relative to said movable die and being in juxtaposition respectively with said transformer die and said substrate,
    said first and second locating guides having holes therein aligned with respective contacts and pads,
    at least one planar locating center guide in fixed relationship to said movable die, positioned intermediate of said first and second planar locating guides and spaced therefrom and having correspondingly sized holes extending therethrough aligned with the holes of said first and second planar locating guides, a plurality of buckling wire probes extending between said transformer die and said substrate and positioned within aligned holes of said locating dies, said buckling wire probes being of a diameter slightly smaller than said holes so as to slide freely therein, and planar slotted offset guides interposed between given pairs of said locating guides and having slots formed therein of a length in excess of the diameter of said buckling wire probes so as to control the lateral buckling of the localized portions of said buckling wire probes between said locating guides with said slots being offset relative to said holes within said locating guides, and wherein said locating guides are spaced from each other at different distances to provide different effective free lengths of said buckling wire probes passing therethrough;

whereby, said wire probes will buckle laterally in sequence through individual buckling modes from the longest effective free length to the shortest effective free length under increasing applied axial compressive force exerted on the wire probes captured between the transformer die and said substrate.

whereby said multiple mode buckling beam probe assembly can effectively increase the axial deflections of said wire probes while allowing greater probing density with the sequence and magnitude of each buckle of the multiple buckling modes being tailored to the specific needs of the probe assembly.

2. The multiple mode buckling beam probe assembly as claimed in claim 1, wherein a pair of vertically spaced center locating guides are interposed between said first and second locating guides, and wherein slotted guides are each respectively interposed between said first locating guide and one of said center guides, between said two center guides, and between a center locating guide and said second locating guide, such that the effective free length of the wire probes from the first locating guide through the second locating guide conforms to the following relationship:

$$EFL_1 > EFL_2 > EFL_3 > (EFL_1/2)$$

wherein $EFL_1$ is the effective free length of the wire probes between the first locating guide and the center locating guide proximate thereto, $EFL_2$ is the effective free length of the wire probes between the center locating guides, and $EFL_3$ is the effective free length of the wire probes between the second locating guide and the center locating guide proximate thereto.

3. A multiple mode buckling beam probe assembly comprising:

an electrical contactor positioned for movement towards and away from a substrate having laterally spaced contacts, said electrical contactor comprising a plurality of relatively equal length wire probes, each probe having a greater length than diameter and being bendable under axially applied loads when said contactor is moved towards said substrate to cause each of the wire probes to contact the substrate, and wherein said probes are at positions corresponding to the contacts on said substrate, mounting means for mounting said probes for free axial movement, said mounting means including means for slidably engaging said probes centrally thereof to divide each probe into two lengths to allow buckling of both lengths and means to control the direction of buckling of each of the lengths under applied axial loads;

whereby, each probe acts completely independently of each other probe, and wherein the portions of said probes to opposite sides of said means for slidably engaging said probes centrally thereof deflect in sequence, dependent upon the effective free length of said probe portions to opposite sides of said means for slidably engaging said probes centrally thereof.

* * * * *